(12) United States Patent
Takeuchi et al.

(10) Patent No.: US 10,070,564 B2
(45) Date of Patent: Sep. 4, 2018

(54) ELECTRIC POWER CONVERTER

(71) Applicant: DENSO CORPORATION, Kariya, Aichi-pref. (JP)

(72) Inventors: Kazuya Takeuchi, Kariya (JP); Tetsuya Matsuoka, Kariya (JP); Ryota Tanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/353,337

(22) Filed: Nov. 16, 2016

(65) Prior Publication Data

US 2017/0142860 A1    May 18, 2017

(30) Foreign Application Priority Data

Nov. 17, 2015 (JP) .................... 2015-225042

(51) Int. Cl.
*H05K 7/20* (2006.01)
*H02M 7/00* (2006.01)
*H02M 7/537* (2006.01)
*H05K 5/02* (2006.01)
*H05K 5/04* (2006.01)

(52) U.S. Cl.
CPC ............ *H05K 7/209* (2013.01); *H02M 7/003* (2013.01); *H02M 7/537* (2013.01); *H05K 5/0256* (2013.01); *H05K 5/04* (2013.01); *H05K 7/2049* (2013.01); *B60L 2210/40* (2013.01); *B60L 2240/525* (2013.01)

(58) Field of Classification Search
CPC ....... H05K 7/20927–7/20936; H05K 7/20218; H05K 7/20263; H05K 7/1432; H05K 7/2039; H05K 7/20445; H01L 23/473

USPC ......... 361/699, 701–702; 363/141; 165/80.4–80.5, 104.33; 257/712–714; 174/547–548

See application file for complete search history.

(56) References Cited

U.S. PATENT DOCUMENTS

| | | | |
|---|---|---|---|
| 2012/0300521 A1* | 11/2012 | Hida | H05K 7/1432 363/131 |
| 2013/0058068 A1* | 3/2013 | Funatsu | H05K 7/20927 361/820 |
| 2013/0070502 A1* | 3/2013 | Suzuki | H02M 7/003 363/131 |
| 2013/0335918 A1* | 12/2013 | Tachibana | H05K 5/0213 361/689 |

(Continued)

FOREIGN PATENT DOCUMENTS

JP    2009-261125 A    11/2009

*Primary Examiner* — Dion R Ferguson
*Assistant Examiner* — Amir Jalali
(74) *Attorney, Agent, or Firm* — Oliff PLC

(57) ABSTRACT

An electric power converter performing power conversion includes a plurality of semiconductor modules with built-in semiconductor elements, a plurality of cooling tubes stacked together with the plurality of semiconductor modules, and a pressure member made of metal. The pressure member has a pressing surface for pressing an outer cooling tube in order to press-contact the plurality of cooling tubes and the plurality of semiconductor modules in a stacking direction, and a heat receiving surface that receives heat generated from a capacitor that is an electronic component which is different from the plurality of semiconductor modules, by thermal conduction.

8 Claims, 10 Drawing Sheets

(56) References Cited

U.S. PATENT DOCUMENTS

| | | | |
|---|---|---|---|
| 2014/0001630 A1* | 1/2014 | Takamura | H01L 23/433 257/719 |
| 2014/0153189 A1* | 6/2014 | Okamura | H05K 1/0213 361/688 |
| 2014/0284765 A1* | 9/2014 | Kiuchi | H01L 28/40 257/532 |
| 2015/0123261 A1* | 5/2015 | Hironaka | H02M 7/003 257/719 |
| 2015/0229206 A1* | 8/2015 | Kaji | H02M 7/003 307/43 |
| 2015/0357109 A1* | 12/2015 | Nobusaka | H01F 27/16 336/58 |

* cited by examiner

ELECTRIC POWER CONVERTER

CROSS-REFERENCE TO RELATED APPLICATION

This application is based on and claims the benefit of priority from earlier Japanese Patent Application No. 2015-225042 filed Nov. 17, 2015, the description of which is incorporated herein by reference.

TECHNICAL FIELD

The present disclosure relates to an electric power converter.

BACKGROUND

Conventionally, an electric power converter for converting DC power from a battery into AC power is mounted in electric vehicle, hybrid vehicles, or the like, for driving a motor for vehicle running.

The electric power converter includes a semiconductor module with a built-in semiconductor element.

The semiconductor module generates heat due to a controlled current flowing through the semiconductor element.

When a semiconductor module with a large capacity is used, a cooler with a high cooling performance is required because there is a tendency that heat generation in the semiconductor module increases.

Furthermore, when designing this type of electric power converter, there is a need to construct an electric power converter that is small in size and has excellent vehicle mountability.

Therefore, an electric power converter constituting a stacked semiconductor unit by alternately stacking semiconductor modules and cooling tubes for cooling the semiconductor modules is disclosed in Japanese Patent Application Laid-Open Publication No. 2009-261125.

A stacked-type cooler in which a plurality of cooling tubes are stacked is used in the electric power converter.

In the cooler, in order to press-contact the plurality of cooling tubes and the plurality of semiconductor modules in a stacking direction, it is configured that a pressure member that is elastically urged by a spring member presses an outer cooling tube positioned at one of outer sides in the stacking direction.

Thus, the semiconductor modules can be cooled from both sides in the stacking direction, thereby improving the cooling efficiency of the semiconductor modules.

Further, the stacked semiconductor unit is configured so as to sandwich a heat dissipating body used for cooling electronic components (heat dissipating bodies) other than the semiconductor module in a space between two adjacent cooling tubes.

The heat dissipating bodies are connected to heat-receiving bodies that receive heat from the electronic components via heat pipes.

However, the electric power converter disclosed in Publication No. 2009-261125 has the following problems.

Extra cooling tubes for sandwiching the heat dissipating bodies are required in the stacked-type cooler.

Therefore, when a flow rate of a cooling medium in the cooler is constant, part of the cooling medium may flow into the extra cooling tubes.

For this reason, the flow rate of the cooling medium flowing through the cooling tubes for cooling the semiconductor modules is reduced.

As a result, a problem that the cooling performance of the cooler to the semiconductor module is lowered may occur.

Further, in order to cool electronic components different from the semiconductor modules, there is a problem that exclusive components such as the heat dissipating body, the heat-receiving body, the heat pipe, or the like becomes necessary in addition to the stacked-type cooler.

SUMMARY

An embodiment provides an electric power converter capable of cooling electronic components different from a semiconductor module by using a stacked-type cooler for cooling the semiconductor module without adding an exclusive component.

In an electric power converter according to a first aspect, the electric power converter that performs power conversion includes a plurality of semiconductor modules with built-in semiconductor elements, a plurality of cooling tubes stacked together with the plurality of semiconductor modules in the stacking direction, and a metallic pressure member.

The metallic pressure member includes a pressing surface that presses an outer cooling tube positioned at one of outer sides in the stacking direction among the plurality of cooling tubes in order to press-contact the plurality of cooling tubes and the plurality of semiconductor modules in the stacking direction, and a heat-receiving surface that receives heat generated from an electronic component which is different from the plurality of semiconductor modules, by thermal conduction.

In the electric power converter, a stacked-type cooler is constituted by the plurality of cooling tubes.

According to the stacked-type cooler, each of the plurality of semiconductor modules can be cooled from both sides in the stacking direction via the plurality of cooling tubes being pressed in the stacking direction by using the pressure member.

The pressure member has the heat-receiving surface that receives heat generated from the electronic component which is different from the plurality of semiconductor modules, by thermal conduction in addition to the pressing surface that presses the outer cooling tube.

In the pressure member, the heat received by the heat-receiving surface is transmitted to the pressing surface, and is dissipated from the pressing surface to the outer cooling tube.

In this case, the pressing surface of the pressure member becomes the heat dissipating surface.

The electronic components are substantially cooled by the stacked-type cooler via the pressure member.

Thus, by using the pressure member used for cooling the semiconductor modules, the electronic components can be cooled without adding an exclusive cooling component.

As described above, according to the above aspect, an electric power converter capable of cooling electronic components different from a semiconductor module by using a stacked-type cooler for cooling the semiconductor module without adding an exclusive component can be provided.

DETAILED DESCRIPTION OF THE PREFERRED EMBODIMENTS

Figure 1:
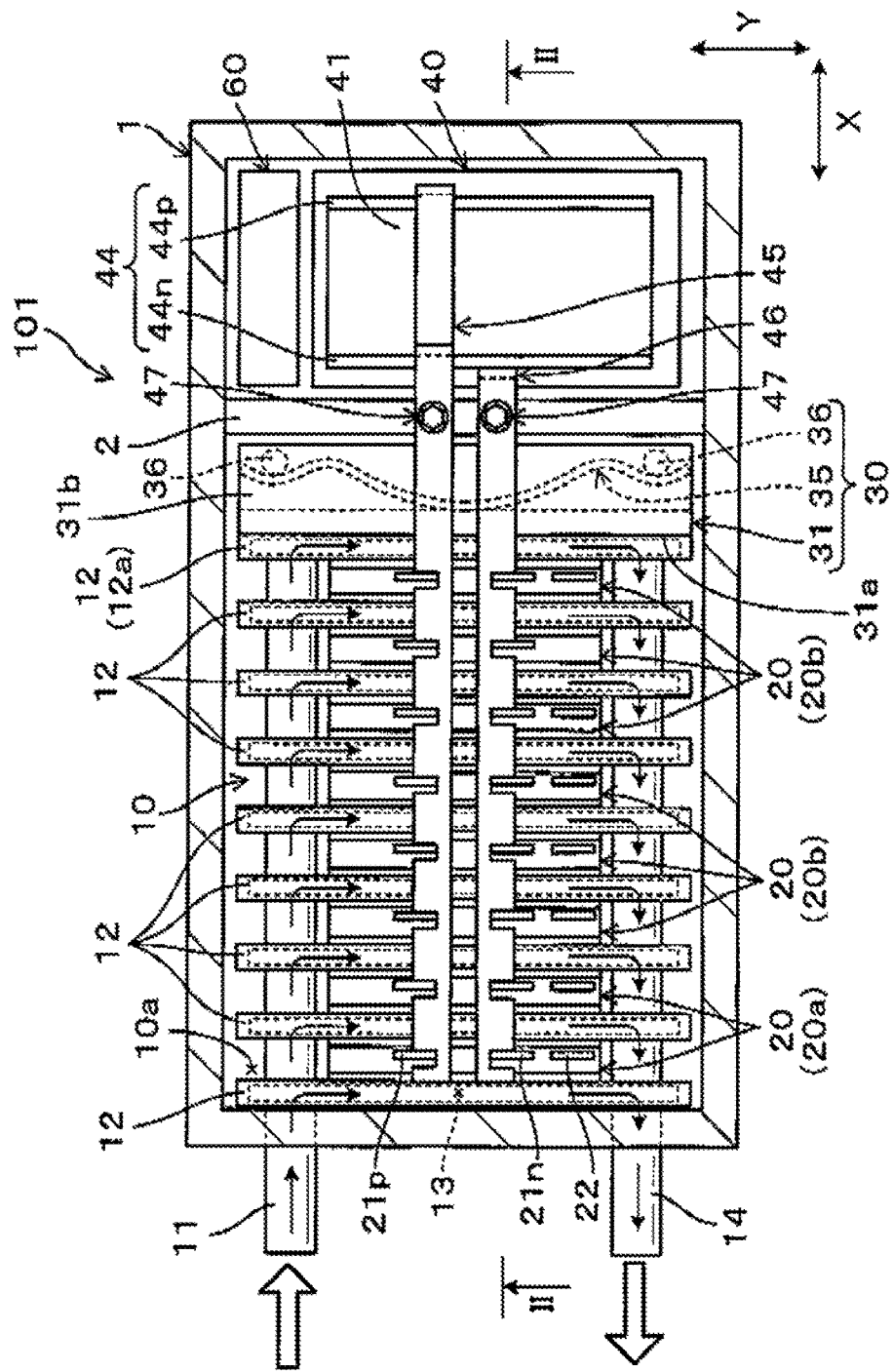
FIG. 1 shows a sectional view of an electric power converter according to a first embodiment.

Hereinafter, embodiments according to an electric power converter will be described with reference to the drawings.

This electric power converter is mounted on a vehicle such as an electric vehicle or a hybrid vehicle, and is configured as a vehicle-mounted electric power converter performing power conversion between DC power and AC power.

It should be noted that in the drawings of the present specification, unless otherwise indicated, a stacking direction (a first direction) of a plurality of cooling tubes in a stacked-type cooler is indicated by an arrow X, a second direction in which the cooling tubes extend is indicated by an arrow Y, and a third direction perpendicular to both the first direction and the second direction is indicated by an arrow Z.

First Embodiment

Figure 2:
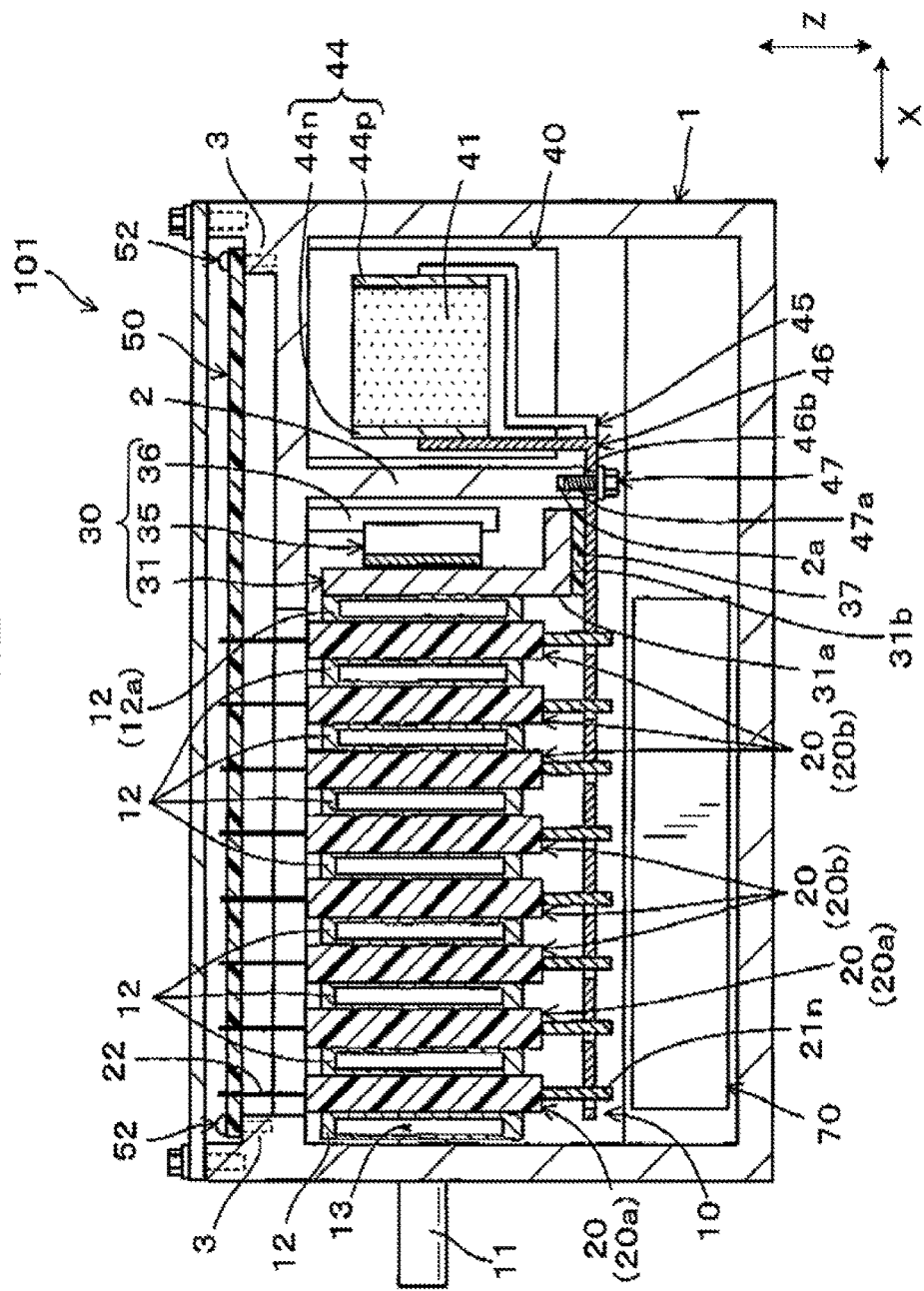
FIG. 2 shows a sectional view taken along a line II-II of FIG. 1.

As shown in FIGS. 1 and 2, an electric power converter 101 of a first embodiment includes a metal case 1.

The case 1 accommodates all the elements such as a cooler 10, a plurality of semiconductor modules 20, a pressing device 30, a capacitor 40, a control board 50, a reactor 60, and a DC-DC converter 70.

The cooler 10 has a function of cooling the plurality of semiconductor modules 20 by utilizing a cooling medium.

The cooler 10 is a stacked-type cooler, and includes a plurality of cooling tubes 12 that are stacked together with the plurality of semiconductor modules 20.

The plurality of cooling tubes 12 are stacked in the first direction X with spaces 10a in which each of the plurality of semiconductor modules 20 is interposed.

In the present embodiment, nine cooling tubes 12 are stacked in the first direction X, and each of the semiconductor module 20 is interposed in each of eight spaces 10a formed by nine cooling tubes 12.

Each of the cooling tubes 12 extends in an elongated shape in the second direction Y, and a sectional shape in the first direction X (a sectional shape in a plane defined by the first direction X and the third direction Z) is rectangular.

The cooling tubes 12 are connected in parallel to a supply header part 11 and a discharge header part 14, respectively, of the cooling medium.

The cooling medium supplied from the supply header part 11 cools the semiconductor modules 20 positioned on both sides in the first direction X of the cooling tubes 12 when flowing through cooling medium passages 13 formed in the cooling tubes 12, then discharged to the discharge header part 14.

As a cooling medium, for example, water mixed with ethylene glycol-based antifreeze, natural cooling medium such as water or ammonia, fluorocarbon cooling medium such as FLUORINERT™, HCFC123, fluorocarbon cooling medium such as HFC134a, alcohol-based cooling medium such as methanol or alcohol, or ketone-based cooling medium such as acetone may be optionally used.

The pressing device 30 includes a pressure member 31, an elastic member 35, and support pins 36.

The pressure member 31 is elastically urged toward an outer cooling tube 12a via the elastic member 35 that are supported by the support pins 36.

The outer cooling tube 12a is a cooling tube 12 positioned at one of outer sides of the first direction X among the plurality of cooling tubes 12.

The pressure member 31 includes a pressing surface 31a and a heat-receiving surface 31b.

The pressing surface 31a is a surface that presses the outer cooling tube 12a according to the elastic urging force of the elastic member 35 in order to press-contact the plurality of cooling tubes 12 and the plurality of semiconductor modules 20 in the first direction X.

The heat-receiving surface 31b is a surface for receiving the heat generated from the capacitor 40 by thermal conduction.

The capacitor 40 is provided with a capacitor element 41, electrode portions 44 and bus bars 45, 46.

The electrode portions 44 are both metallikon electrodes (sprayed metal electrodes) made of a pair of metal electrodes 44p, 44n.

One of the metal electrodes 44p is connected to positive terminals 21p of semiconductor elements 21 via a metal plate-shaped bus bar 45.

Likewise, another one of the metal electrodes 44n is connected to negative terminals 21n of the semiconductor elements 21 via a metal plate-shaped bus bar 46.

The capacitor element 41 has a low thermal conductivity in a direction between metal electrodes.

It is configured that the heat generated by the capacitor 40 is transmitted to the bus bars 45, 46 via the pair of metal electrodes 44p, 44n.

Thus, the bus bars 45, 46 are configured as heat dissipating portions of the capacitor 40.

Both bus bar 45 and bus bar 46 extend in an elongated shape in the first direction X, and are fixed by tightening fastening bolts 47 to an upright wall 2 disposed in the case 1 in a state of sandwiching electrically insulating heat dissipating sheets 37 between the heat-receiving surface 31b of the pressure member 31.

It should be noted that in the following description, the electrically insulating heat dissipating sheets 37 may be simply referred to as the sheets 37.

Thus, the sheets 37 are pressed against in a a compression direction by the bus bars 45, 46.

In a case of the bus bar 46, for example, as FIG. 2 is referred to, a bolt shaft 47a of the fastening bolt 47 is screwed to a bolt hole 2a of the upright wall 2 through a through-hole 46b that penetrates the bus bar 46 in a thickness direction thereof.

The fastening bolts 47 are fixing members for fixing the bus bars 45, 46 to the case 1, as well as constituted as urging members that urge the bus bars 45, 46 so that the sheets 37 are pressed by the bus bars 45, 46.

Figure 3:
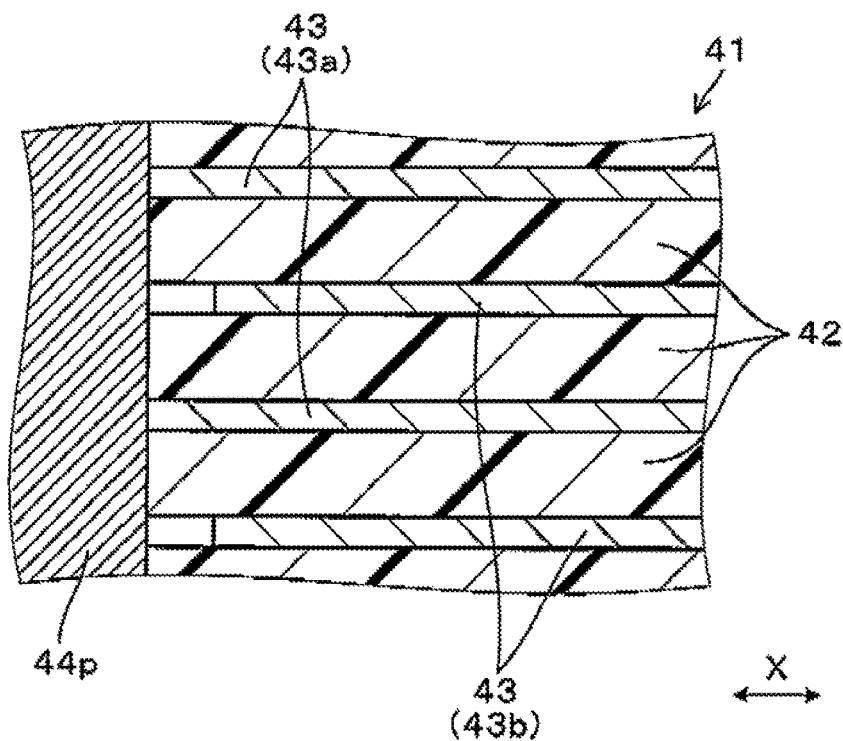
FIG. 3 shows an enlarged sectional view of a capacitor element according to the first embodiment.

As shown in FIG. 3, the capacitor element 41 of the capacitor 40 is a film capacitor element composed of dielectric films 42 where metal layers 43 are formed on film surfaces.

The capacitor element 41 is formed by winding the dielectric films 42 around an imaginary axis of the first direction X.

The dielectric film 42 is made of synthetic resin (PET, PP, PPS, PEN, etc.).

The metal layer 43 is formed by depositing a metal (Al, Zn, etc.) on the surface of the dielectric film 42.

The metal layers 43 include first metal layers 43a connected to one of the metal electrodes 44p, and second metal layers 43b connected to another one of the metal electrodes 44n.

The first metal layers 43a and the second metal layers 43b extend in parallel with each other in the first direction X.

Figure 4:
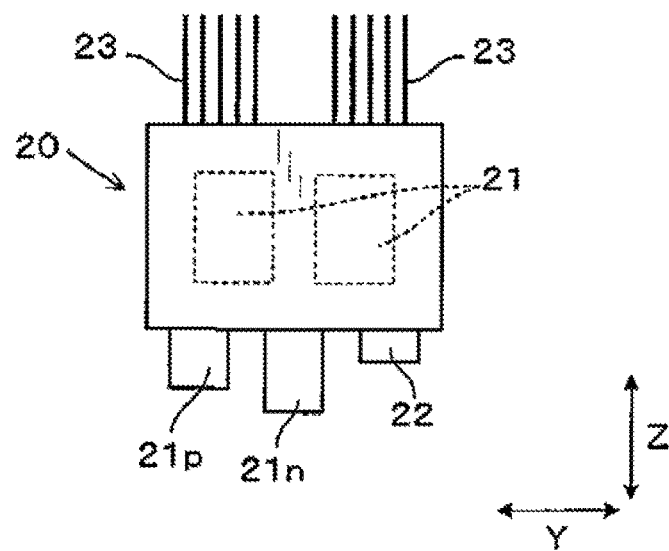
FIG. 4 shows a front view of a semiconductor module according to the first embodiment.

As shown in FIG. 4, the semiconductor module 20 is a 2 in 1 type module incorporating the two semiconductor elements 21 in a module body.

The semiconductor module 20 includes the above-mentioned positive and negative terminals 21p, 21n that are a pair of electrode terminals, an output terminal 22 connected to a positive side of an auxiliary battery (an auxiliary battery 82 shown in FIG. 6) to be described later, and control terminals 23 connected to a control circuit in the control board 50 for driving and controlling the semiconductor elements 21.

Here, more detailed configuration of the above-mentioned pressing device 30 will be described with reference to FIG. 5.

Figure 5:
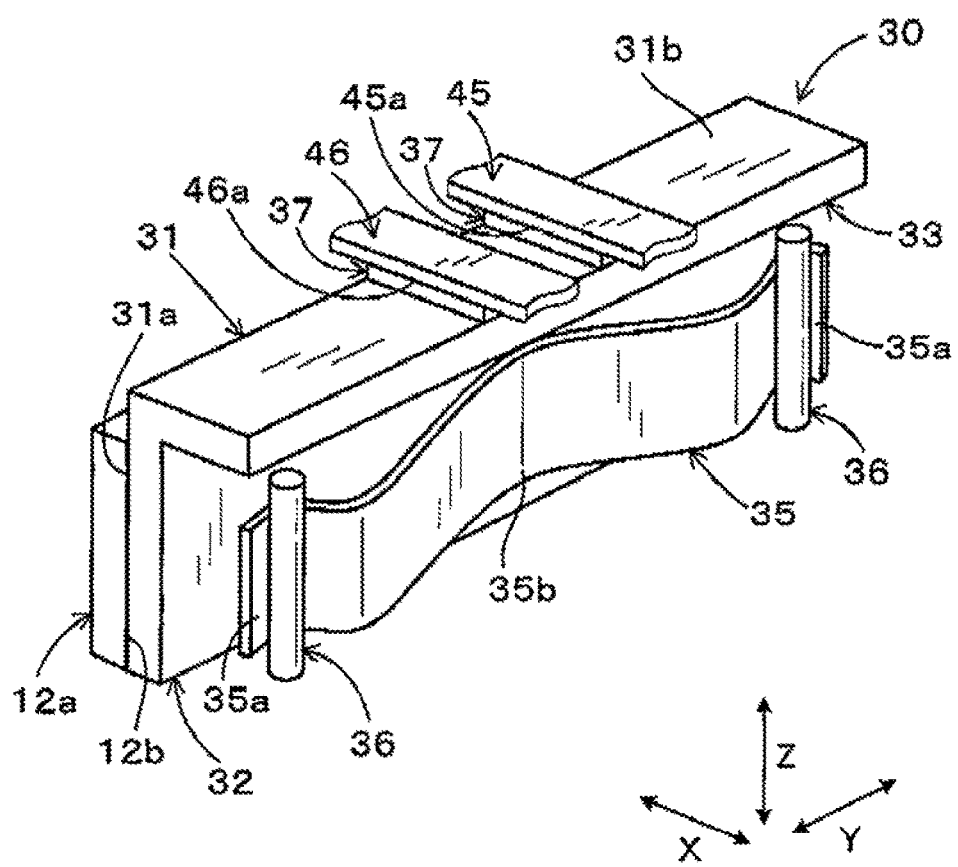
FIG. 5 shows a perspective view of a pressing device according to the first embodiment.

As shown in FIG. 5, the pressure member 31 is composed of a plate member having a substantially L-shaped sectional shape formed by a vertical plate portion 32 and a horizontal plate portion 33.

The pressure member 31 is made of a metal material such as stainless steel, or carbon steel.

The vertical plate portion 32 is a plate-like portion extending on a plane defined by the second direction Y and the third direction Z.

One of surfaces in the thickness direction (first direction X) of the vertical plate portion 32 becomes the above-mentioned pressing surface 31a.

The pressing surface 31a is a flat surface in surface-contact with a main surface 12b of the outer cooling tube 12a.

An area of the pressing surface 31a exceeds an area of the main surface 12b of the outer cooling tube 12a, and the pressing surface 31a is in surface-contact with the entire surface of the main surface 12b.

In this case, the pressing surface 31a is configured as a heat dissipating surface that dissipates the heat by thermal conduction from the pressure member 31 to the outer cooling tube 12a.

The horizontal plate portion 33 is a plate-like portion extending on a plane defined by the first direction X and second direction Y.

The horizontal plate portion 33 is configured such that it crosses at right angles to the vertical plate portion 32, and one end portion (an end portion on the left in FIG. 5) of the horizontal plate portion 33 is continuously connected to one end (an end portion on the top in FIG. 5) of the vertical plate portion 32.

One of the surfaces in the thickness direction (the third direction Z) of the horizontal plate portion 33 becomes the above-mentioned heat-receiving surface 31b.

In the horizontal plate portion 33, the sheet 37 is interposed between the heat-receiving surface 31b and a facing surface 45a of the bus bar 45, and the sheet 37 is interposed between the heat-receiving surface 31b and a facing surface 46a of the bus bar 46.

Accordingly, the heat-receiving surface 31b of the pressure member 31 is in contact with the bus bars 45, 46 that are the heat dissipating portions of the capacitor 40 via the sheets 37, and receives the heat generated from the capacitor 40 by thermal conduction.

The elastic member 35 has a function of elastically urging the pressure member 31 toward the outer cooling tube 12a.

In the present embodiment, the elastic member 35 is constituted as a leaf spring made of a metal material.

The elastic member 35 has a curved portion 35b, which is curved to form a projection toward the pressure member 31, in a central region between both end portions 35a, 35a in the second direction Y.

The elastic member 35 is in contact with the vertical plate portion 32 of the pressure member 31 at the curved portion 35b.

Each of the end portions 35a, 35a of the elastic member 35 is supported by the support pins 36 fixed to the case 1 from a side opposite to the pressure member 31 in the first direction X.

The elastic urging force acting on the vertical plate portion 32 of the pressure member 31 from the curved portion 35b of the elastic member 35 is transmitted to the outer cooling tube 12a after being uniformly dispersed in the second direction Y in the vertical plate portion 32.

In this case, the pressure member 31 presses the outer cooling tube 12a to a side opposite to the elastic member 35 in a state where the pressing surface 31a is in surface-contact with the main surface 12b of the outer cooling tube 12a.

Therefore, it is possible to uniformly press the plurality of cooling tubes 12 and the plurality of semiconductor modules 20 in the first direction X by the pressure member 31.

Note that in addition to or instead of the leaf spring, a coil spring, a rubber or the like may be used as the elastic member 35.

The sheet 37 is a sheet constituting an electrically 80 insulating layer formed of an electrically insulating material, and it includes in particular an electric insulation and a thermal conductivity (heat dissipation).

The sheet 37 has characteristics that include a withstand voltage performance of equal to or more than 5 kV/mm for electric insulation, and a thermal conductivity coefficient equal to or more than 0.5 W/m·K for thermal conductive properties.

The sheet 37 has high electrical insulation and high thermal conductive properties.

Thus, the pressure member 31 and the bus bars 45, 46, both made of metal materials, are electrically insulated by the sheet 37 separating therebetween.

Further, it is possible to promote heat transfer from the bus bars 45, 46 to the pressure member 31 through the sheet 37.

The sheet 37 is typically constituted by using a synthetic resin of which a main component is silicone.

Figure 6:
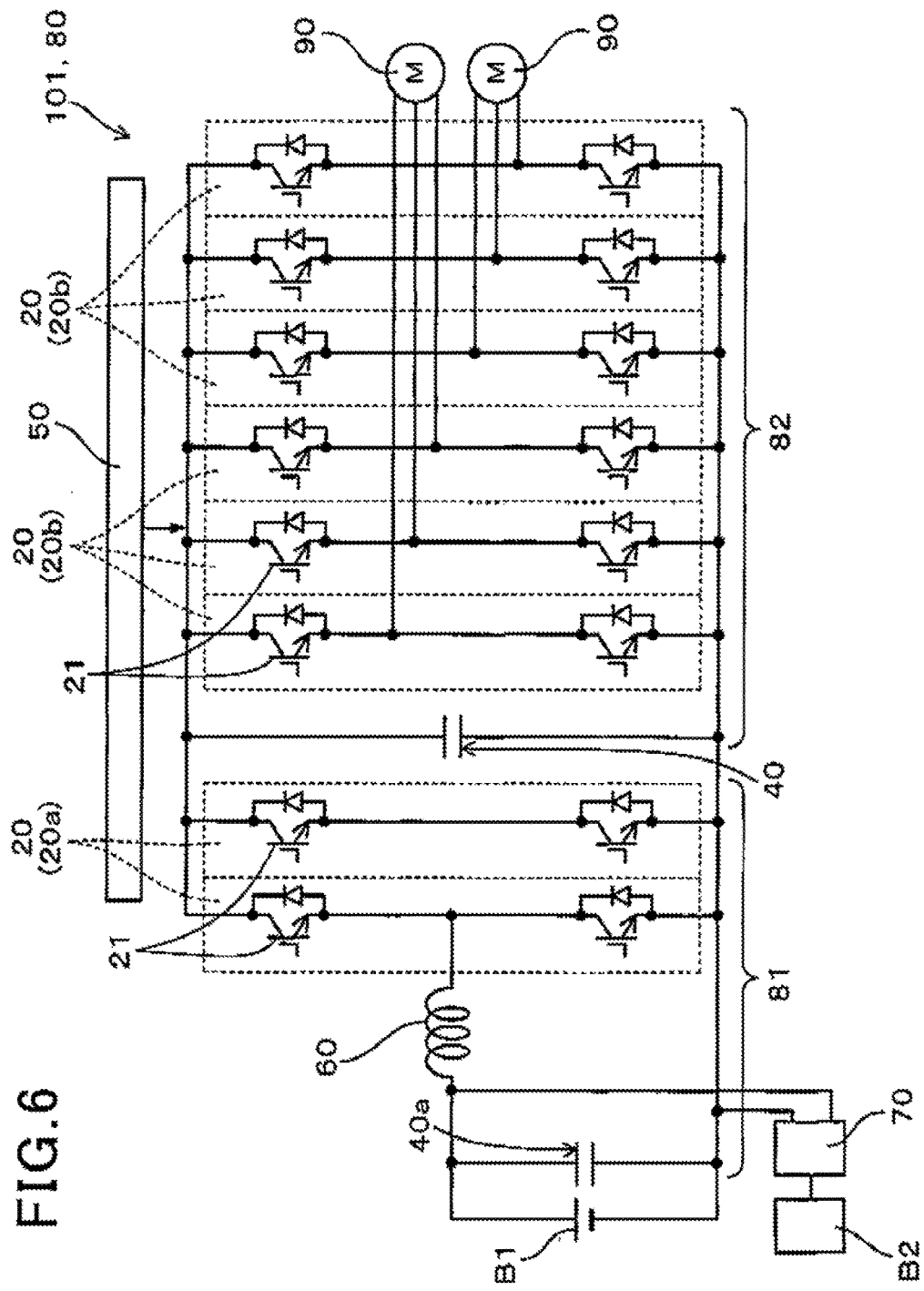
FIG. 6 shows an inverter circuit diagram of the electric power converter according to the first embodiment.

As shown in FIG. 6, the electric power converter 101 constitute an inverter circuit 80 that is a power conversion circuit for converting DC power supplied from a DC power supply B1 to AC power.

In the inverter circuit 80, a plurality of semiconductor module 20 are connected to the control board 50, and a switching operation (ON/OFF operation) is controlled by the control board 50.

As shown in FIG. 2, the control board 50 is fixed to the upright wall 3 disposed in the case 1 through fastening bolts 52 as fixing members similar to the fastening bolts 47 mentioned above.

In the present embodiment, a boosting section 81 of the inverter circuit 80 that is the power conversion circuit is constituted by the capacitor 40a, the reactor 60 and two semiconductor modules 20a.

The boosting section 81 has a function of boosting the voltage of the DC power supply B1 by the switching operation of the semiconductor modules 20a (ON/OFF operation).

The capacitor 40a is a capacitor for eliminating noise currents contained in a current supplied from the DC power supply B1, and is referred to as a filter capacitor.

The capacitor 40a is configured as a capacitor with the film capacitor element similar to the capacitor 40 mentioned above.

The reactor 60 is a passive element using an inductor.

On the other hand, a conversion section 82 of the inverter circuit 80 that is the power conversion circuit is constituted by the capacitor 40 and six semiconductor modules 20b.

The conversion section 82 has a function of converting the AC power to DC power after being boosted by the boosting section 81 by the switching operation (ON/OFF operation) of the semiconductor modules 20b.

The capacitor 40 is a capacitor for smoothing the DC power boosted by the boosting section 81, and is referred to as a smoothing capacitor.

Three-phase AC motors 90 for vehicle running are driven by the AC power obtained by the conversion section 82.

The DC-DC converter 70 is connected to the DC power supply B1.

The DC-DC converter 70 is used for stepping down the voltage of the DC power supply B1, and for charging the auxiliary battery 82 having lower voltage than the DC power supply B1.

The auxiliary battery 82 is used as a power supply for various devices mounted on the vehicle.

Next, the operation and effect of the present embodiment are described.

The stacked-type cooler 10 is composed by the plurality of cooling tubes 12 in the electric power converter 101 described above.

According to the stacked-type cooler 10, it is possible to cool each of the plurality of semiconductor modules 20 from both sides in the first direction X through the plurality of cooling tubes 12 pressed by using the pressure member 31.

Therefore, it is possible to improve the cooling efficiency of the plurality of semiconductor modules 20.

In addition, an electric power converter 101 that is small in size and has excellent vehicle mountability can be obtained.

The pressure member 31 has the heat-receiving surface 31b that receives heat generated from the capacitor 40 that is the electronic component which is different from the plurality of semiconductor modules 20, by thermal conduction in addition to the pressing surface 31a that presses the outer cooling tube 12a.

In the pressure member 31, the heat received by the heat-receiving surface 31b is transmitted to the pressing surface 31a, and is dissipated from the pressing surface 31a to the outer cooling tube 12a.

In this case, the pressing surface 31a of the pressure member 31 becomes a heat dissipating surface.

Thus, the capacitor 40 is substantially cooled by the stacked-type cooler 10 via the pressure member 31.

In the electric power converter 101, the heat-receiving surface 31b of the pressure member 31 is in contact with the bus bars 45, 46, which are heat dissipating portions of the capacitor 40, via the sheets 37 formed of the electrically insulating material.

Since the sheets 37 have electrical insulation properties, the insulation of metal contact portions between the pressure member 31 and the bus bars 45, 46 can be ensured.

Further, since the sheets 37 have the thermal conductivity (the heat dissipation), the heat transferred to the bus bars 45, 46 from the pair of metal electrodes 44p, 44n in the capacitor 40 can be efficiently dissipated to the pressure member 31.

As a result, it is possible to efficiently cool the capacitor element 41 of the capacitor 40 from both sides (metal electrode surface sides).

In the electric power converter 101 described above, the bus bars 45, 46 of the capacitor 40 are urged so as to press the sheets 37 by the fastening bolts 47 as the urging members.

Thereby, a state of contact between the bus bars 45, 46 and the sheets 37 becomes better, and a thermal resistance in the sheets 37 is reduced by compressing the sheets 37.

As a result, the conductivity of heat transmitted from the bus bars 45, 46 to the pressure member 31 via the as sheets 37 becomes better, thus it is possible to improve the cooling performance of the capacitor 40.

In addition, the fastening bolts 47 are the fixed members for fixing the bus bar 45, 46 to the case 1, and they are concurrently serving as the urging members and the fixing members.

Therefore, by using the existing fixing members, it is possible to press the sheets 37 without increasing the number of parts.

As described above, according to the present embodiment, the electric power converter 101 capable of cooling the capacitor 40 that is the electronic component which is different from the plurality of semiconductor modules 20 without adding an exclusive component by using the stacked-type cooler 10 that cools the semiconductor modules 20 can be provided.

Second Embodiment

Figure 7:
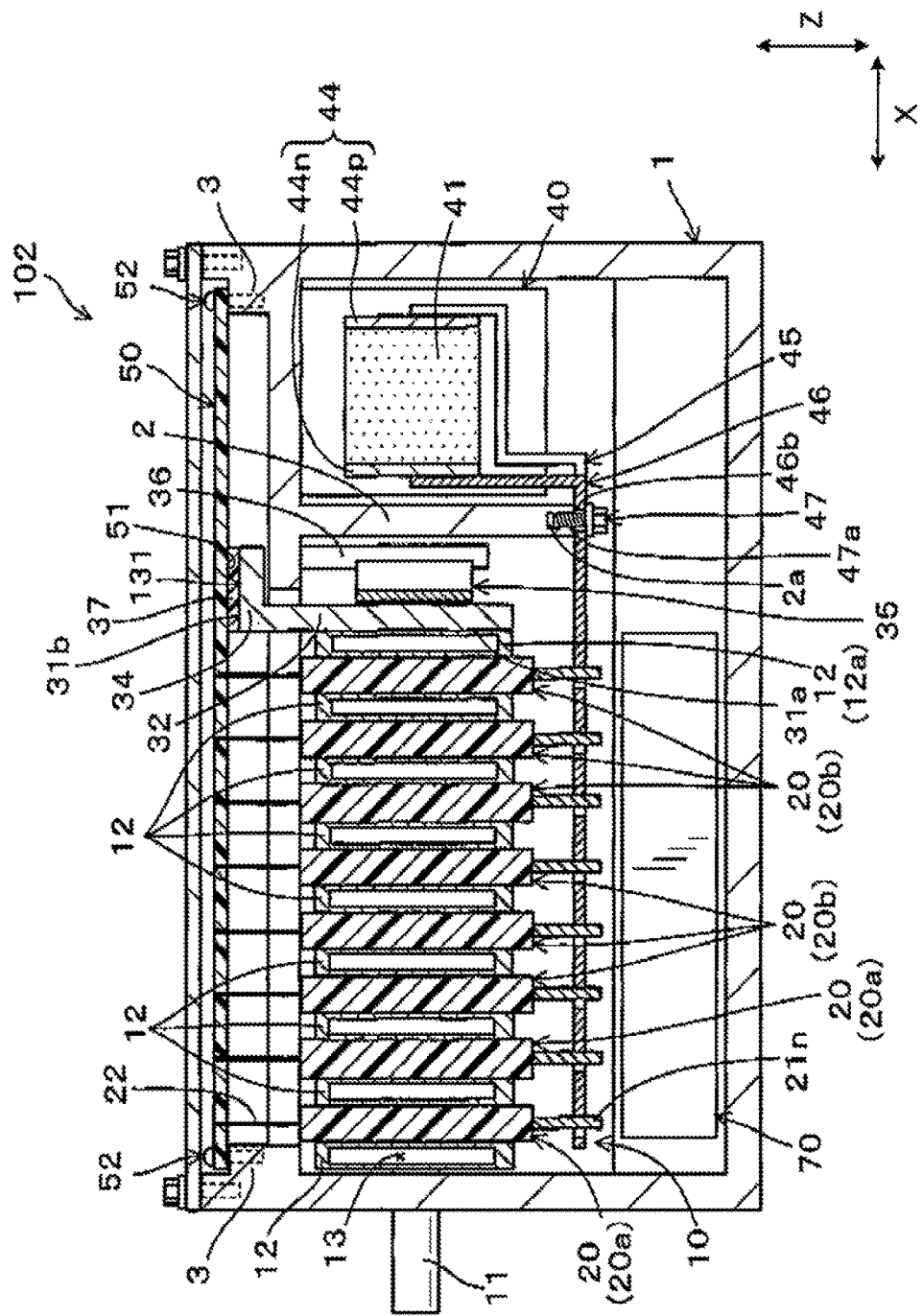
FIG. 7 shows a sectional view of an electric power converter according to a second embodiment.

As shown in FIG. 7, an electric power converter 102 of a second embodiment is provided with another pressure member 131 in place of the pressure member 31 in the first embodiment.

Other configurations are the same as those in the first embodiment.

Therefore, it should be appreciated that in the drawings describing the second embodiment, components other than the pressure member 131 and identical with or similar to those in the first embodiment are given the same reference numerals, and repeated structures and features thereof will not be described in order to avoid redundant explanation.

Figure 8:
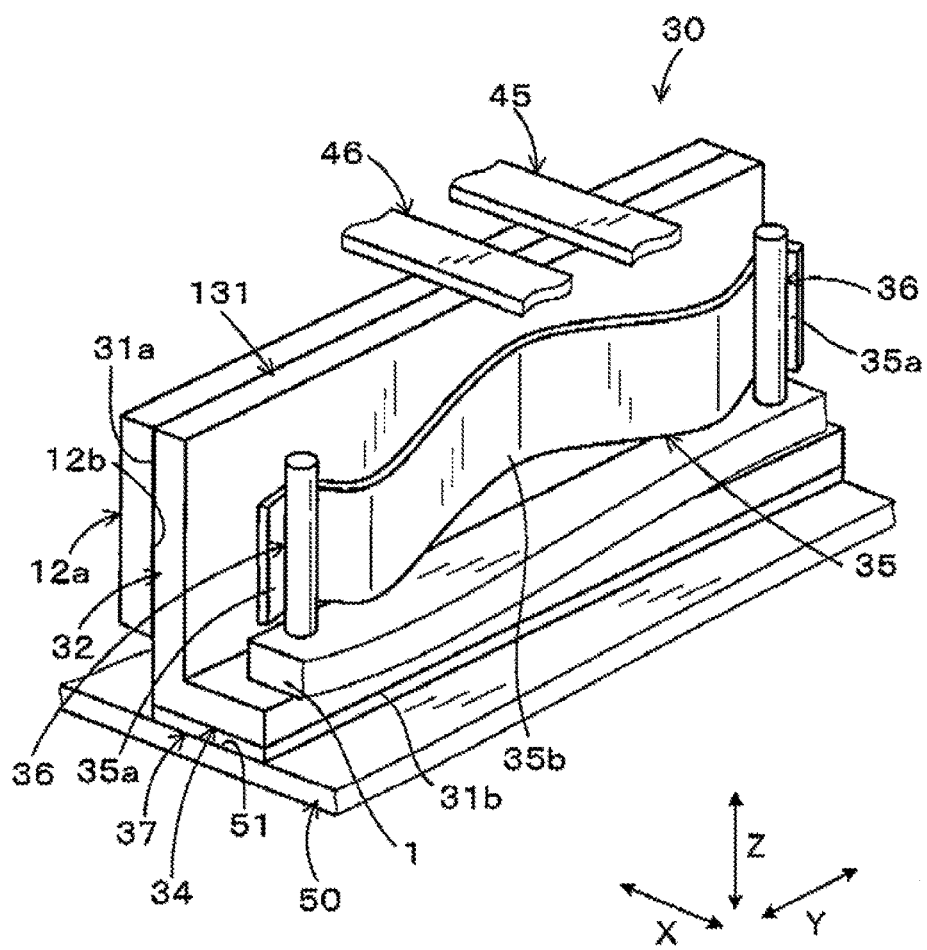
FIG. 8 shows a perspective view of a pressing device according to the second embodiment.

As shown in FIG. 8, the pressure member 131 is composed of a plate member having a substantially L-shaped sectional shape formed by a vertical plate portion 32 and a horizontal plate portion 34.

The pressure member 131 has the same shape as the above-mentioned pressure member 31 to which the horizontal plate portion 33 is omitted, and the horizontal plate portion 34 having the same shape as the horizontal plate portion 33 is added.

The horizontal plate portion 34 is configured such that it crosses at right angles to the vertical plate portion 32, and one end portion (an end portion on the left in FIG. 8) of the horizontal plate portion 34 is continuously connected to one end (an end portion on the top in FIG. 8) of the vertical plate portion 32.

One of the surfaces in the thickness direction (the third direction Z) of the horizontal plate portion 34 becomes the above-mentioned heat-receiving surface 31b.

In the horizontal plate portion 34, the sheet 37 is interposed between the heat-receiving surface 31b and a board surface 51 that is a heat dissipating portion of the control board 50.

Therefore, the heat-receiving surface 31b of the pressure member 131 is in contact with the board surface 51 of the control board 50 via the sheet 37, and receives the heat generated from the control board 50 by thermal conduction.

The board surface 51 of the control board 50 is fixed to the upright wall 3 disposed in the case 1 by tightening the fastening bolts 52 in a state where the sheet 37 is sandwiched between the board surface 51 and the heat-receiving surface 31b of the pressure member 131.

Thus, the sheet 37 is pressed in its compression direction by the board surface 51 of the control board 50.

The fastening bolts 52 are configured as the fixing members for fixing the control board 50 to the case 1, as well as the urging members that urge the board surface 51 of the control board 50 so that the sheet 37 is pressed by the board surface 51.

In the above-mentioned electric power converter 102, the pressure member 131 has the heat-receiving surface 31b that receives heat generated from the control board 50 that is the electronic component which is different from the plurality of semiconductor modules 20, by thermal conduction.

In the pressure member 131, the heat received by the heat-receiving surface 31b is transmitted to the pressing surface 318, and is dissipated from the pressing surface 31a to the outer cooling tube 12a.

Thus, the control board 50 is substantially cooled by the stacked-type cooler 10 via the pressure member 131.

In the above electric power converter 102, the heat-receiving surface 31b of the pressure member 131 is in contact with the board surface 51 of the control board 50 via the sheet 37.

Accordingly, the insulation of metal contact portions between the pressure member 131 and the board surface 51 can be ensured.

Furthermore, it is possible to efficiently dissipate the heat of the board surface 51 of the control board 50 to the pressure member 131.

As a result, it is possible to efficiently cool the control board 50.

In the above electric power converter 102, the board surface 51 of the control board 50 is urged so as to press the sheet 37 by the fastening bolts 52 as the urging members.

Thereby, a state of contact between the board surface 51 and the sheet 37 becomes better, and the thermal resistance in the sheet 37 is reduced by compressing the sheet 37.

As a result, it is possible to improve the cooling performance of the control board 50.

In addition, the fastening bolts 52 are the fixing members for fixing the control board 50 to the case 1, and it is possible to press the sheet 37 without increasing the number of parts.

As described above, according to the present embodiment, an electric power converter 102 can be provided that is capable of cooling the control board 50 that is the electronic component which is different from the plurality of semiconductor modules 20 without adding an exclusive component by using the stacked-type cooler 10 that cools the semiconductor modules 20.

Apart from that, it has the same functions and effects as the first embodiment.

Third Embodiment

Figure 9:
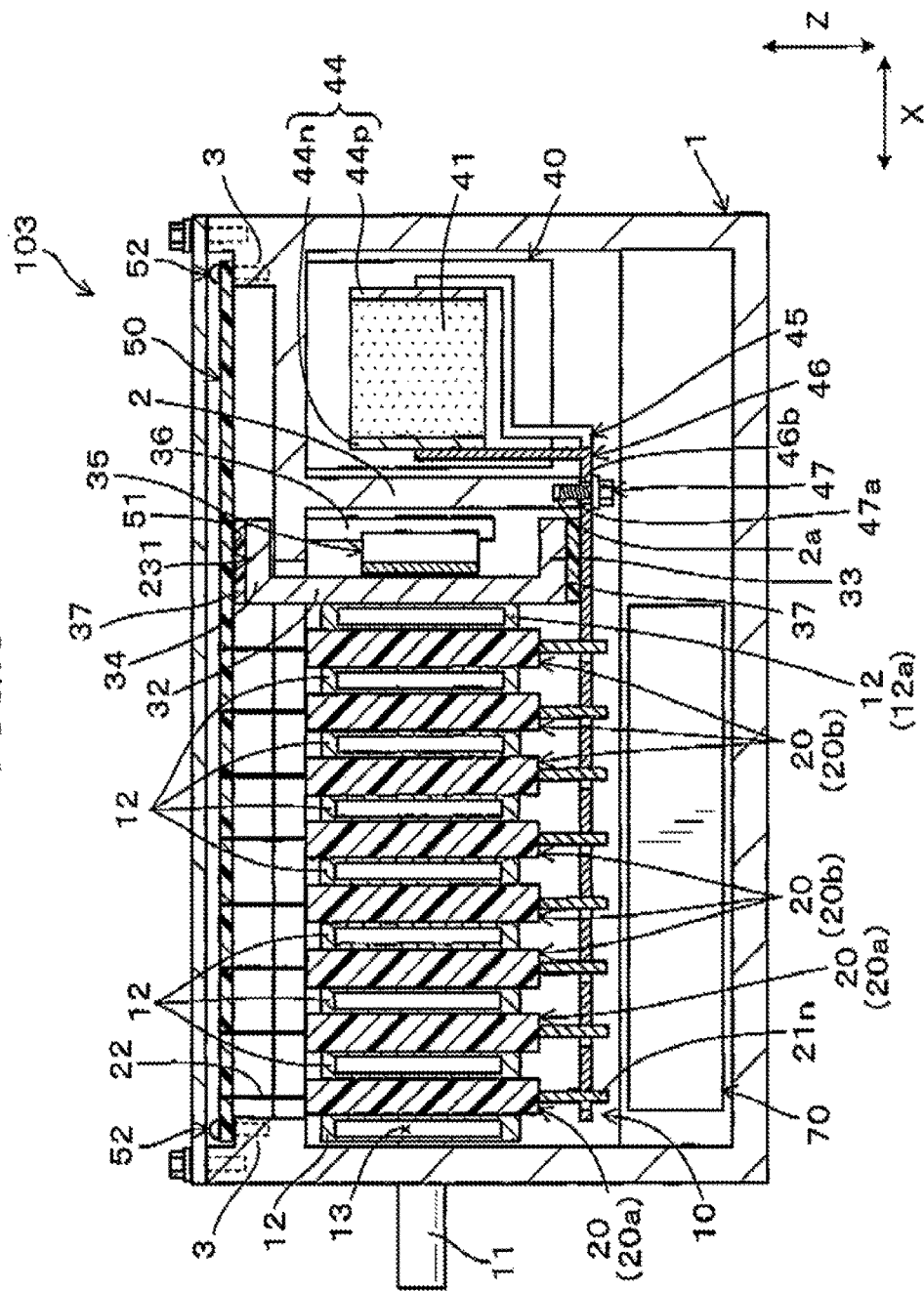
FIG. 9 shows a sectional view of an electric power converter according to a third embodiment.

As shown in FIG. 9, an electric power converter 103 of a third embodiment is provided with another pressure member 231 in place of the pressure member 31 in the first embodiment or the pressure member 131 in the second embodiment.

Other configurations are the same as those in the first embodiment or the second embodiment.

Therefore, it should be appreciated that in the drawings describing the third embodiment, components other than the pressure member 231 and identical with or similar to those in the first or second embodiments are given the same reference numerals, and repeated structures and features thereof will not be described in order to avoid redundant explanation.

Figure 10:
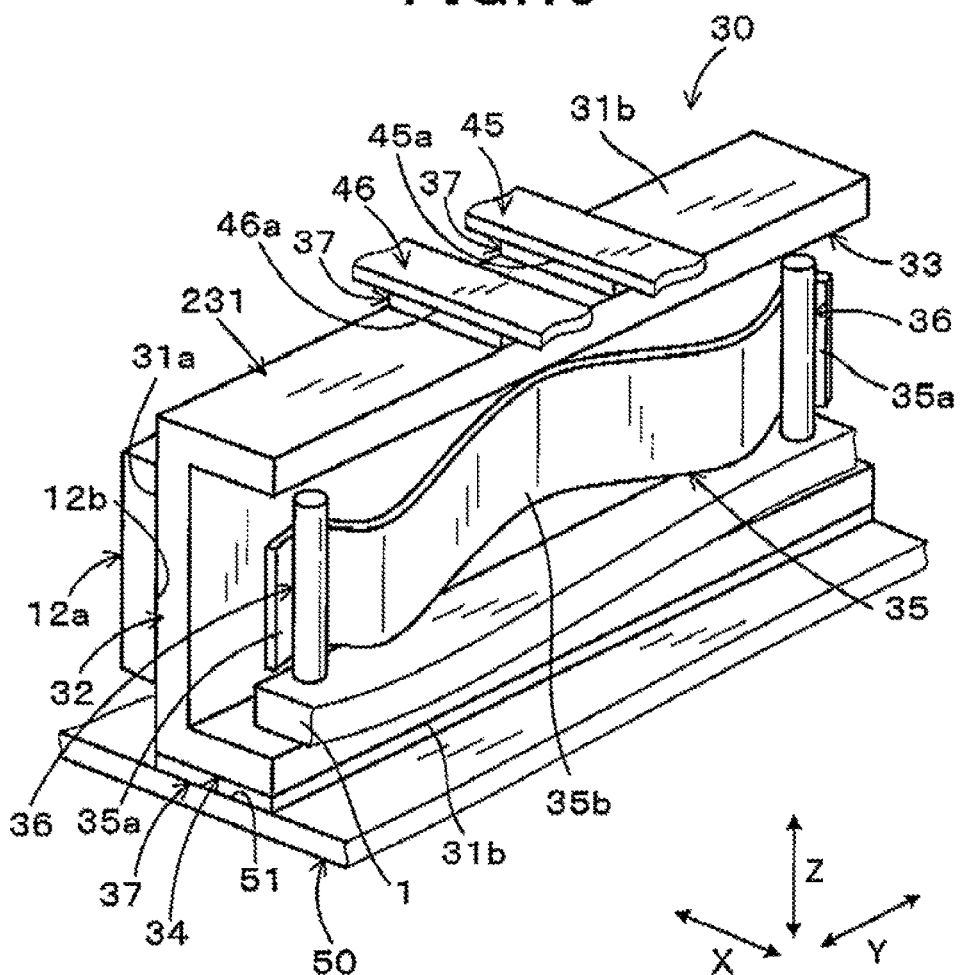
FIG. 10 shows a perspective view of a pressing device according to the third embodiment.

As shown in FIG. 10, the pressure member 231 is composed of a plate member formed by a vertical plate portion 32, a horizontal plate portion 33, and another horizontal plate portion 34.

That is, the pressure member 231 has the same shape as the above-mentioned pressure member 31 to which the horizontal plate portion 33 having the same shape as the horizontal plate portion 34 is added, or the above-mentioned pressure member 131 to which the horizontal plate portion 33 is added.

Accordingly, the pressure member 231 is that having both the functions of both the pressure member 31 and the pressure member 131, and has two heat-receiving surfaces 31b, 31b.

One of the heat-receiving surfaces 31b disposed on the horizontal plate portion 33 is constituted so as to be in contact with the bus bars 45, 46 that are the heat dissipating portions of the capacitor 40 via the sheets 37, and to receive the heat generated from the capacitor 40 by thermal conduction.

The other one of the heat-receiving surfaces 31b disposed on the horizontal plate portion 34 is constituted so as to be in contact with the board surface 51 of the control board 50 via the sheet 37, and to receive the heat generated from the control board 50 by thermal conduction.

As described above, according to the present embodiment, the electric power converter 103 can be provided which is capable of cooling both the capacitor 40 and the control board 50 that are the electronic components different from the plurality of semiconductor modules 20 without adding an exclusive component by using the stacked-type cooler 10 that cools the semiconductor modules 20.

Apart from that, it has the same functions and effects as the first and second embodiments.

Fourth Embodiment

Figure 11:
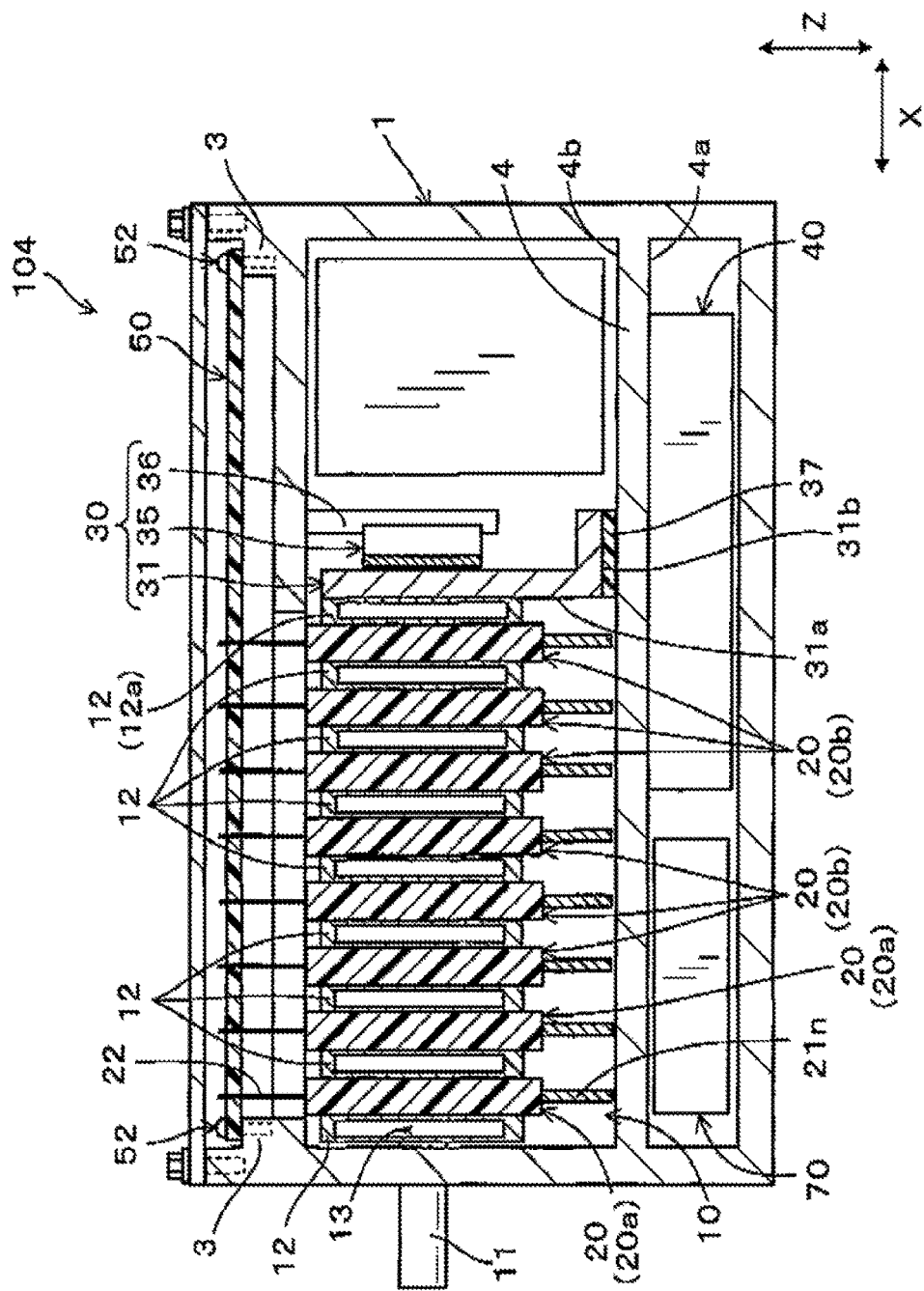
FIG. 11 shows a sectional view of an electric power converter according to a fourth embodiment.

As shown in FIG. 11, an electric power converter 104 of a fourth embodiment an embodiment in which the configuration of the electric power converter 101 of the first embodiment has been changed such that the capacitor 40 is in contact with the case 1, and the heat-receiving surface 31b of the pressure member 31 is in contact with the case 1 via the sheet 37.

Other configurations are the same as those in the first embodiment.

The case 1 has a plate-like partition portion 4 for partitioning between a cooler 10 and a capacitor 40.

The capacitor 40 is configured to contact with a first surface 4a of the partition portion 4 of the case 1.

A heat-receiving surface 31b of a pressure member 31 is configured so as to be in contact with a second surface 4b of the partition portion 4 via a seat 37.

In this case, after the heat generated from the capacitor 40 is transmitted to the partition portion 4, it is transmitted to the heat-receiving surface 31b of the pressure member 31 further via the sheet 37.

That is, the heat-receiving surface 31b of the pressure member 31 is in thermally contact with the capacitor 40 via the case 1.

The term "thermally contact" means that not only a case where two members are in direct contact with, but also means that a case where the heat can be transferred from one member to another member even if a third member or more is interposed therebetween.

The case 1 is made of metal, and has a good thermal conductivity.

Further, the second surface 4b of the partition portion 4 has a larger area than the heat-receiving surface 31b of the pressure member 31.

Therefore, the heat transmitted from the capacitor 40 to the partition portion 4 is easily transmitted to the heat-receiving surface 31b of the pressure member 31.

In short, it is possible to rapidly cool the capacitor 40 by using the partition portion 4 (i.e., the case 1).

Accordingly, the cooling performance of the capacitor 40 is improved as compared with a case where the capacitor 40 is not in contact with the partition portion 4 of the case 1.

Further, the sheet 37 is configured as a thermal conductive layer having a thermal conductivity (heat dissipation) as described above.

For this reason, the cooling performance of the capacitor 40 is further improved.

Incidentally, it may be configured that the capacitor 40 is in contact with one of the surfaces 4a, 4b of the partition portion 4, and the heat-receiving surface 31b of the pressure member 31 is in contact with the surface to which the capacitor 40 is in contact with via the sheet 37 if necessary.

Further, in order to further improve the thermal conductivity, it is preferred to fix the pressure member 31 to the partition portion 4 by using a fixing member such as the fastening bolt 47 so that the sheet 37 is compressed.

As described above, according to the present embodiment, the electric power converter 104 capable of cooling the capacitor 40 that is the electronic component which is different from the plurality of semiconductor modules 20 without adding an exclusive component by using the stacked-type cooler 10 that cools the semiconductor modules 20 can be provided.

Apart from that, it has the same functions and effects as the first embodiment.

The present disclosure is not limited to the typical embodiments described above; however, various modifications may be considered within the scope of the present disclosure.

For example, it is also possible to carry out the following respective embodiments based on the above embodiments.

Although a case where the sheet 37 having electrical insulation and thermal conductivity is interposed between the heat-receiving surface 31b of the pressure member 31, 131, 231 and the heat dissipating portion of the electronic components has been described in the above embodiment, a solid or greasy material having the same performance as the sheet 37 may be applied to the heat-receiving surface 31b instead of the sheet 37.

In addition, it is also possible to employ a member having only electrical insulation instead of the sheet 37.

Furthermore, if there is no need for electrical isolation between the pressure member 31, 131, 231 and the heat dissipating portion of the electronic component, it is possible to omit the sheet 37, or employ a member having only thermal conductivity (heat dissipation) instead of the sheet 37.

When omitting the sheet 37, the heat-receiving surface 31b of the pressure member 31, 131, 231 is configured to contact directly with the heat dissipating portion of the electronic component.

Although a case that the fixing member for fixing the heat dissipating portion of the electronic component to the case 1 and the urging member that urges the heat dissipating portion of the electronic component so that the electrically insulating layer is pressed is configured by the same fastening bolts 47, 52 are described in the above embodiments, the fixing member and the urging member may be a separate member.

In this case, a spring, an elastic member such as rubber may be used as the urging member.

On the other hand, in a case where the desired thermal conductivity from the heat dissipating portion of the electronic component to the pressure member can be obtained even without pressing the electrically insulating layer, the urging member can be omitted.

Although an example of a capacitor 40 and a control board 50 as electronic components to be cooled by the stacked-type cooler 10 separately from the semiconductor module 20 is described in the above embodiment, at least one of the capacitor 40a, the reactor 60, and the DC-DC converter 70 can also be employed as an electronic component.

Although cases that the pressure member 31, 131 has one heat-receiving surface 31b in the first and second embodiments and the pressure member 231 has two heat-receiving surfaces 31b in the third embodiment are described, the number of heat-receiving surface that corresponds the member the pressure member is not as limited to these embodiments, but may be variously modified as needed.

For example, it is possible to employ a constitution in which a member corresponding to the pressure member has three or more heat-receiving surfaces.

What is claimed is:

1. An electric power converter that performs power conversion comprising:
   a plurality of semiconductor modules with built-in semiconductor elements;
   a plurality of cooling tubes stacked together with the plurality of semiconductor modules in a stacking direction; and
   a metallic pressure member;
   wherein the metallic pressure member includes:
      a pressing surface that presses an outer cooling tube positioned at one of outer sides in the stacking direction among the plurality of cooling tubes in order to press-contact the plurality of cooling tubes and the plurality of semiconductor modules in the stacking direction; and
      a heat-receiving surface that receives heat generated from an electronic component which is different from the plurality of semiconductor modules, by thermal conduction, and
   wherein the heat-receiving surface of the pressure member superimposes a heat dissipating portion of the electronic component via an electrically insulating layer formed of an electrically insulating material.

2. The electric power converter according to claim 1, wherein, the electrically insulating layer is constituted by a sheet which is electrically insulating and has thermal conductivity.

3. The electric power converter according to claim 1, wherein, the electric power converter further includes an urging a member for urging the heat dissipating portion of the electronic component so that the electrically insulating layer is pressed by the heat dissipating portion.

4. The electric power converter according to claim 3, wherein, the electric power converter further includes a case for accommodating the plurality of semiconductor modules and the plurality of cooling tubes together with the pressure member, and a fixing member for fixing the heat dissipating portion of the electronic component to the case; and the urging member is constituted by the fixing member.

5. The electric power converter according to claim 1, wherein, the electronic component is a capacitor constituting a power conversion circuit;

the capacitor includes a capacitor element, and a pair of metal electrodes connected to the capacitor element, wherein, metal bus bars respectively connect the pair of metal electrodes to the plurality of semiconductor modules; and the heat dissipation portion of the electronic component is constituted by the bus bars.

6. The electric power converter according to claim 1, wherein, the electronic component is a control board for controlling the plurality of semiconductor modules.

7. The electric power converter of claim 1, wherein, the electric power converter further includes a metal case for accommodating the plurality of semiconductor modules and the plurality of cooling tubes together with the pressure member, the case being in contact with the electronic component; and the pressure member is constituted such that the heat-receiving surface is in thermal contact with the electronic component via the case.

8. The electric power converter according to claim 7, wherein, the heat-receiving surface of the pressure member is in contact with the case via a thermal conductive layer made of a material having a thermal conductivity so as to thermally contact with the electronic component via the case.

* * * * *